(12) United States Patent
Qawami et al.

(10) Patent No.: US 11,494,302 B2
(45) Date of Patent: Nov. 8, 2022

(54) PHASE CHANGE MEMORY IN A DUAL INLINE MEMORY MODULE

(71) Applicant: Micron Technology, Inc., Boise, ID (US)

(72) Inventors: Shekoufeh Qawami, El Dorado Hills, CA (US); Jared E. Hulbert, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 650 days.

(21) Appl. No.: 16/518,869

(22) Filed: Jul. 22, 2019

(65) Prior Publication Data
US 2020/0019501 A1    Jan. 16, 2020

Related U.S. Application Data

(62) Division of application No. 15/392,697, filed on Dec. 28, 2016, now Pat. No. 10,437,722, which is a division of application No. 14/097,125, filed on Dec. 4, 2013, now Pat. No. 9,576,662, which is a division of application No. 12/504,029, filed on Jul. 16, 2009, now Pat. No. 8,626,997.

(51) Int. Cl.
| | |
|---|---|
| *G06F 12/0802* | (2016.01) |
| *G11C 13/00* | (2006.01) |
| *G06F 12/0804* | (2016.01) |
| *G11C 11/00* | (2006.01) |
| *G11C 11/406* | (2006.01) |
| *G11C 14/00* | (2006.01) |

(52) U.S. Cl.
CPC ...... *G06F 12/0802* (2013.01); *G06F 12/0804* (2013.01); *G11C 11/005* (2013.01); *G11C 11/40607* (2013.01); *G11C 13/0004* (2013.01); *G11C 14/009* (2013.01); *G06F 2212/1032* (2013.01); *G06F 2212/2024* (2013.01); *G06F 2212/3042* (2013.01); *G06F 2212/60* (2013.01)

(58) Field of Classification Search
CPC .. G06F 12/0802; G06F 12/0804; G06F 13/00; G11C 11/005
See application file for complete search history.

(56) References Cited

U.S. PATENT DOCUMENTS

| | | | |
|---|---|---|---|
| 5,758,056 A | 5/1998 | Barr | |
| 6,000,006 A | 12/1999 | Bruce et al. | |
| 6,603,757 B1 * | 8/2003 | Locascio | H04L 49/351 |
| | | | 370/352 |
| 6,765,812 B2 | 7/2004 | Anderson | |
| 6,847,580 B2 | 1/2005 | Ebihara et al. | |
| 6,909,656 B2 | 6/2005 | Moore et al. | |
| 7,224,595 B2 | 5/2007 | Preps et al. | |
| 7,336,098 B2 | 2/2008 | Wang et al. | |
| 7,397,695 B2 | 7/2008 | Nakai et al. | |

(Continued)

FOREIGN PATENT DOCUMENTS

| | | |
|---|---|---|
| CN | 1142635 A | 2/1997 |
| CN | 1797376 A | 7/2006 |

(Continued)

OTHER PUBLICATIONS

Japanese Office Action for Patent Application No. 2010-151680 dated Jan. 6, 2015.

(Continued)

*Primary Examiner* — Tuan V Thai
(74) *Attorney, Agent, or Firm* — Holland & Hart LLP

(57) ABSTRACT

Subject matter disclosed herein relates to management of a memory device.

19 Claims, 5 Drawing Sheets

(56) References Cited

U.S. PATENT DOCUMENTS

| | | |
|---|---|---|
| 8,189,328 B2 | 5/2012 | Kanapathippillai et al. |
| 8,209,479 B2 | 6/2012 | Rajan et al. |
| 8,244,971 B2 * | 8/2012 | Rajan .................. G11C 11/4063 365/194 |
| 8,688,899 B2 | 4/2014 | Nellans et al. |
| 8,924,639 B2 * | 12/2014 | Ahn ........................ G06F 12/06 711/170 |
| 2007/0156996 A1 | 7/2007 | Chung |
| 2009/0113144 A1 | 4/2009 | Tokunaga |
| 2010/0115180 A1 | 5/2010 | Lee et al. |
| 2010/0211725 A1 | 8/2010 | Nagashima et al. |
| 2011/0307665 A1 | 12/2011 | Rudelic et al. |

FOREIGN PATENT DOCUMENTS

| | | |
|---|---|---|
| JP | H 06215589 A | 8/1994 |
| TW | I273435 B | 2/2007 |
| WO | WO 02058069 A2 | 7/2002 |

OTHER PUBLICATIONS

Notice of Preliminary Rejection dated Jul. 16, 2014 in Korean Patent Application No. 10-2010-51646.

Office Action and Search Report dated Nov. 29, 2013 in PRC Patent Application No. 201010222395.1.

Office Action dated Mar. 25, 2014 in Japanese Patent Application No. 2010-151680.

Office Action dated May 4, 2015 in ROC (Taiwan Patent Application No. 099121412).

Office Action in a German Patent Application No. 10 2010 030 742.4.

Ooshita, Jun'Ichi, "Non-volatile memories for replacing DRAM: Its installation starts from cell phones and servers,", Nikkei Micro devices, Japan, Nikkei Business Publications, Inc., Oct. 1, 2008, No. 280 (Oct. 1 Issue), 5 pages.

Toru Onuki, "Super H processor", CQ Publishing Co., Ltd., Aug. 1, 2000, Second Edition, 18 pages.

* cited by examiner

PHASE CHANGE MEMORY IN A DUAL INLINE MEMORY MODULE

CROSS REFERENCE TO RELATED APPLICATIONS

The present application for patent is a divisional application of U.S. patent application Ser. No. 15/392,697 by Qawami et al., entitled "Phase Change Memory in a Dual Inline Memory Module," filed Dec. 28, 2016, which is a divisional application of U.S. patent application Ser. No. 14/097,125 by Qawami et al., entitled "Phase Change Memory in a Dual Inline Memory Module," filed Dec. 4, 2013, which is a divisional application of U.S. patent application Ser. No. 12/504,029 by Qawami et al., entitled "Phase Change Memory in a Dual Inline Memory Module," filed Jul. 16, 2009, assigned to the assignee hereof, and expressly incorporated by reference herein.

BACKGROUND

Field

Subject matter disclosed herein relates to management of a memory device.

Description of the Related Art

Memory devices are employed in many types of electronic devices, such as computers, cell phones, PDA's, data loggers, games, and navigational equipment, for example. Among such electronic devices, various types of memory devices may be employed, such as NAND and NOR flash, SRAM, DRAM, and phase-change, just to name a few examples. Corresponding to increases in operating speed and cache line sizes, memory devices may be packaged in a dual inline memory module (DIMM) configuration. For example, such a DIMM, which may be used as a main memory in a computing platform, may comprise a number of DRAM memory modules mounted in parallel on the DIMM. Accordingly, a read/write request to the DIMM may be split across parallel DRAM modules so that individual DRAM modules provide a subset of total cache line request. Such DRAM devices typically have particular intrinsic parameters associated with read/write timing, memory page size, and/or addressing protocol, just to name a few examples.

BRIEF DESCRIPTION OF THE DRAWINGS

Non-limiting and non-exhaustive embodiments will be described with reference to the following figures, wherein like reference numerals refer to like parts throughout the various figures unless otherwise specified.

DETAILED DESCRIPTION OF EMBODIMENTS

Figure 1:
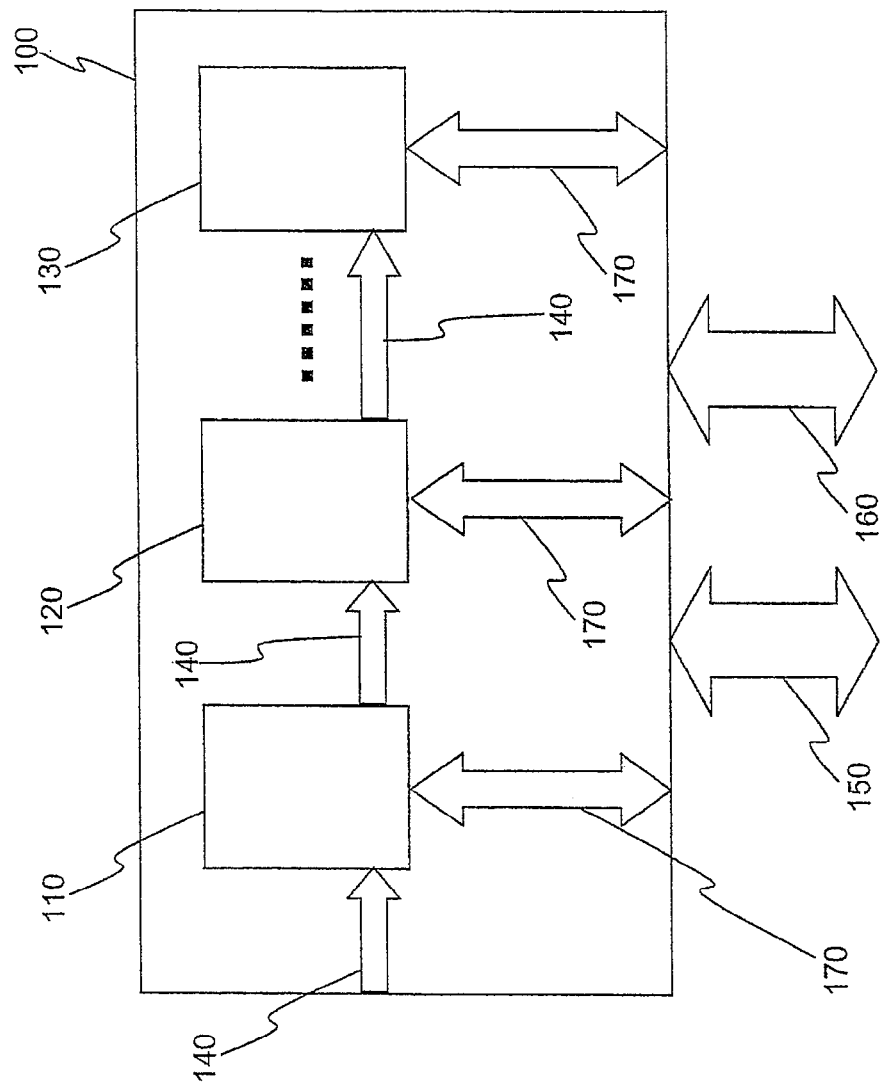
FIG. 1 is a schematic diagram of a memory configuration, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device may comprise a dual inline memory module (DIMM) that includes phase change memory (PCM) modules. Such PCM modules may be mounted and electronically connected in parallel on a DIMM. In one implementation, such a DIMM, which may comprise at least a portion of a main memory of a computing system for example, may include a memory bus to communicate with a memory controller. Through such a memory bus, a computing system may access PCM modules on a DIMM via a memory controller.

In one embodiment, a DIMM may be adapted to electronically operate based, at least in part, on dynamic random access memory (DRAM) modules. For example, a DIMM may comprise one or more DRAM sockets to receive one or more PCM modules, though claimed subject matter is not so limited. For another example, one or more PCM modules may comprise DRAM mode registers and/or a DRAM interface including connections adapted for a DRAM. PCM modules may be incorporated in such a DIMM by using appropriate memory-level and/or system-level processes and/or parameters, as explained in greater detail below. For example, a computing system may comprise a basic input/output system (BIOS) that maintains parameters corresponding to PCM modules. Such parameters may, for example, comprise values for timing, latencies, and/or size of PCM modules. In a particular implementation, a BIOS need not test PCM modules upon a system boot. Such a BIOS may include a low-level driver configured to operate PCM modules. In addition, such a BIOS may include executable code to read PCM module identification (ID) and to be responsive to PCM module configuration. For another example, PCM modules may be associated with an additive latency that enables a column address, generated by a memory controller for example, to be provided to a DIMM immediately after the DIMM receives a row address. Such additive latency may be introduced in a timing scheme of PCM modules so that consecutive read commands directed to the PCM may immediately follow one another without delay and without introducing timing gaps in output data, for example.

In general, writing or programming processes may be used to store information in memory devices, while a read process may be used to retrieve stored information. Stored information may be erased from all or a portion of a memory device and/or new information may be written into all or a portion of memory device. Relatively large numbers of such program-erase and/or program-re-program cycles may degrade the physical integrity of a PCM. For example, thousands of program-erase cycles imposed on a DIMM that incorporates PCM may reduce a reliability of the DIMM. If using such PCM memory, it may be beneficial to limit and/or reduce the number of occurrences of program-erase cycles, or "cycling", that a PCM memory may otherwise be subjected to. Accordingly, in one embodiment, a technique to manage cycling of PCM modules on a DIMM may comprise caching write data. In particular, a memory device, such as a DRAM cache memory, may be used to cache write data corresponding to particular addresses of a PCM DIMM. A memory size of such a DRAM cache memory may be selected based, at least in part, on properties of PCM modules comprising a PCM DIMM. Such properties may include PCM DIMM size, for example. Such properties may include, for example, cycling specifications of PCM, PCM failure rate, PCM write speed, write usage model of a system incorporating a PCM DIMM, and/or PCM write wear leveling techniques used. As a particular example, a size of such a DRAM cache memory may range from about 100 KB to several tens of megabytes RAM, though claimed subject matter is not so limited.

In one implementation, a PCM DIMM may include PCM modules stacked in a package with multiple memory dice per package. For example, such a package may comprise two, four, or eight dice per package, providing one, two, four, or eight I/O pins, respectively. A result of such an implementation may be that additional PCM may be used without presenting extra loading on output drivers, for example. Also, if PCM used in a DIMM has a smaller number of banks (partitions) than that of a DRAM, bank address bits may be used to access multiple banks across multiple PCM devices, as explained in further detail below.

FIG. 1 is a schematic diagram of a DRAM DIMM 100 that comprises multiple DRAM modules, according to an embodiment, including DRAM 110, DRAM 120, and DRAM 130, which are shown in the figure. Although eight DRAM modules may be included in a particular embodiment, a DRAM DIMM may include any number of DRAM modules. For example, a ninth DRAM module may be present to provide error correction, though claimed subject matter is not so limited to such an example. Individual DRAM modules may comprise a matrix of addressable memory cells that are accessed by first specifying a row address after which a column address is specified. Block arrow 150 represents an address bus through which a memory controller (not shown) may provide a read/write address to DRAM DIMM 100. In one particular implementation, such an address bus may be sixteen bits wide. Block arrow 160 represents a data bus through which parallel data from/to DRAM modules may provide read data or receive write data to/from the memory controller and/or other portion of a computing system (not shown). In one particular implementation, such a data bus may be sixty-four bits wide to account for eight eight-bit DRAM modules connected in parallel, though claimed subject matter is not so limited. To address a particular location on DRAM DIMM 100, an activate command, explained in further detail below, may be accompanied by a row address provided to DRAM modules 110 through 130 by a memory controller, for example, on a bus represented by block arrows 140. Such a row address bus 140 may be connected in parallel to individual DRAM modules. Subsequent to providing a row address, a memory controller may generate a read/write command accompanied by a column address provided to the individual DRAM modules via a bus represented by block arrows 170. Of course, such features and details of a DRAM DIMM are merely examples, and claimed subject matter is not so limited.

Figure 2:
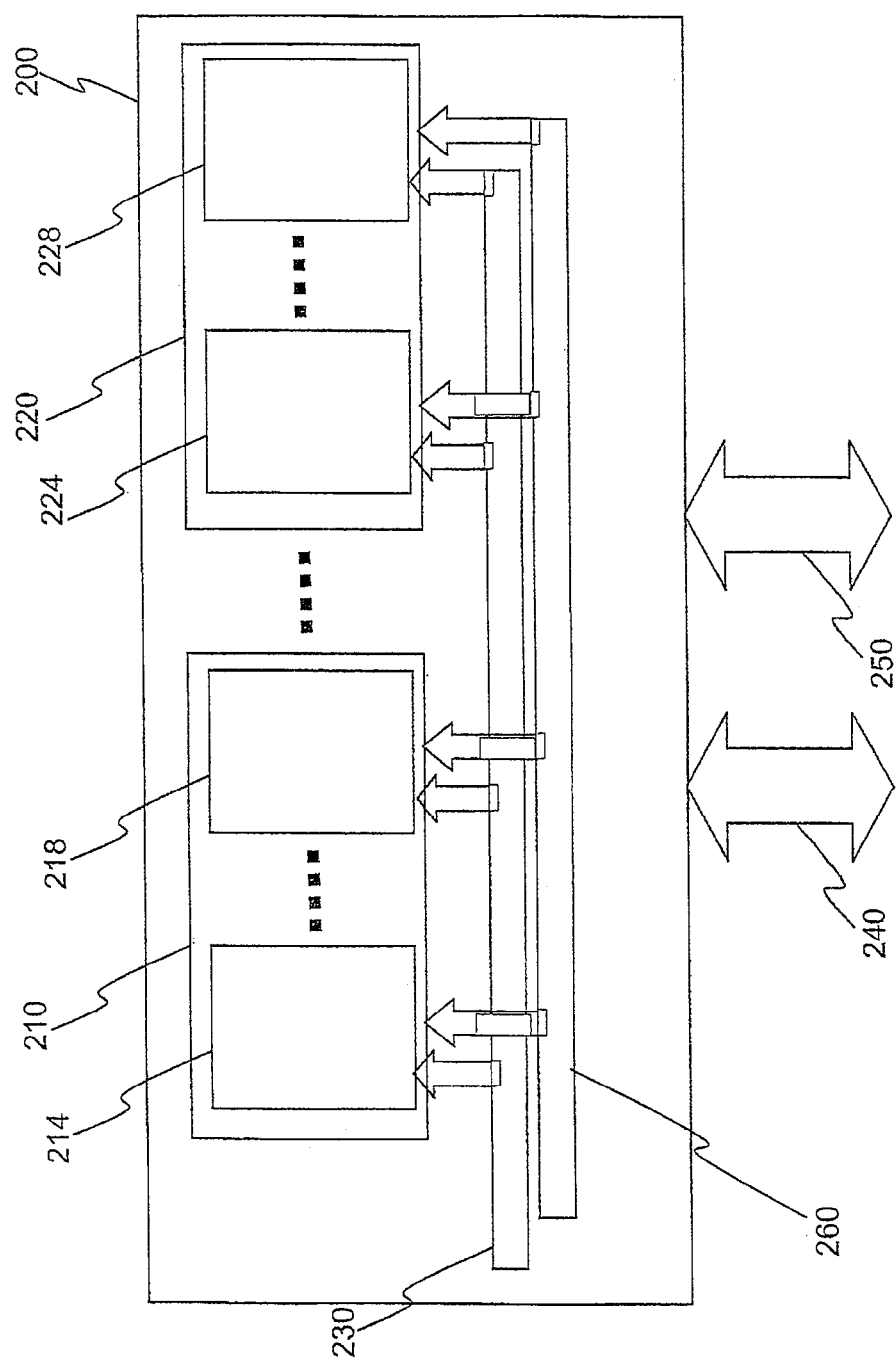
FIG. 2 is a schematic diagram of a memory configuration, according to another embodiment.

FIG. 2 is a diagram view of a PCM DIMM 200 that comprises multiple PCM modules, according to an embodiment, including PCM 214, PCM 218, PCM 224, and PCM 228. PCM DIMM 200 may be adapted to electronically operate based, at least in part, on DRAM modules. In such a case, more than one PCM module may be used in place of one DRAM module, depending, at least in part, on the number of memory banks in individual PCM modules. Accordingly, PCM DIMM 200 may comprise a memory site 210 where PCM 214 and/or PCM 218 are used in place of one DRAM module and a memory site 220, where PCM 224 and/or PCM 228 may used in place of another DRAM module. Here, a memory site refers to a location of PCM DIMM 200 where electronic connections between PCM DIMM 200 and a DRAM or PCM modules may be made. In a particular implementation, a PCM module may involve more electronic connections than a DRAM module. For example, PCM DIMM 200 may include PCM modules that have four banks and three-bit bank addresses (capable of addressing up to eight banks); two PCM devices each with four bank addresses may then be accessed. Accordingly, in a particular implementation, a PCM DIMM may be provided with bank address bits that correspond to multiple memory banks across multiple PCM devices. Of course, such memory sites may include more or less than the number of PCM modules shown and described in the present example embodiment. Similarly, PCM DIMM 200 may include more or less than the number of such memory sites shown and described in the present example embodiment. Accordingly, claimed subject matter is not so limited to such details.

Similar to DRAM modules described above, individual PCM modules may comprise a matrix of addressable memory cells which are accessible by first specifying a row address after which a column address is specified. Block arrow 240 represents an address bus through which a memory controller (not shown) may provide a read/write address to PCM DIMM 200. In one particular implementation, such an address bus may be sixteen bits wide, for example. Block arrow 250 represents a data bus through which parallel data from/to PCM modules may provide read data or receive write data to/from the memory controller and/or other portion of a computing system (not shown). In one particular implementation, such a data bus may be sixty-four bits wide to account for eight parallel groups of PCM modules, each group having eight bits connected in parallel, though claimed subject matter is not so limited. To address a particular location on PCM DIMM 200, an activate command, explained in further detail below, may be accompanied by a row address provided to PCM modules 214 through 228 by a memory controller, for example, on a bus represented by block arrows 230. Such an address bus 230 may be connected in parallel to individual PCM modules. Subsequent to providing a row address, a memory controller may generate a read/write command accompanied by a column address provided to individual memory sites 210 through 220 via a bus 230. Such a column address accompanied by a read/write command may also be provided to individual PCM modules 214 through 228 via a bus represented by block arrows 260. Of course, such features and details of a PCM DIMM are merely examples, and claimed subject matter is not so limited.

Figure 3:
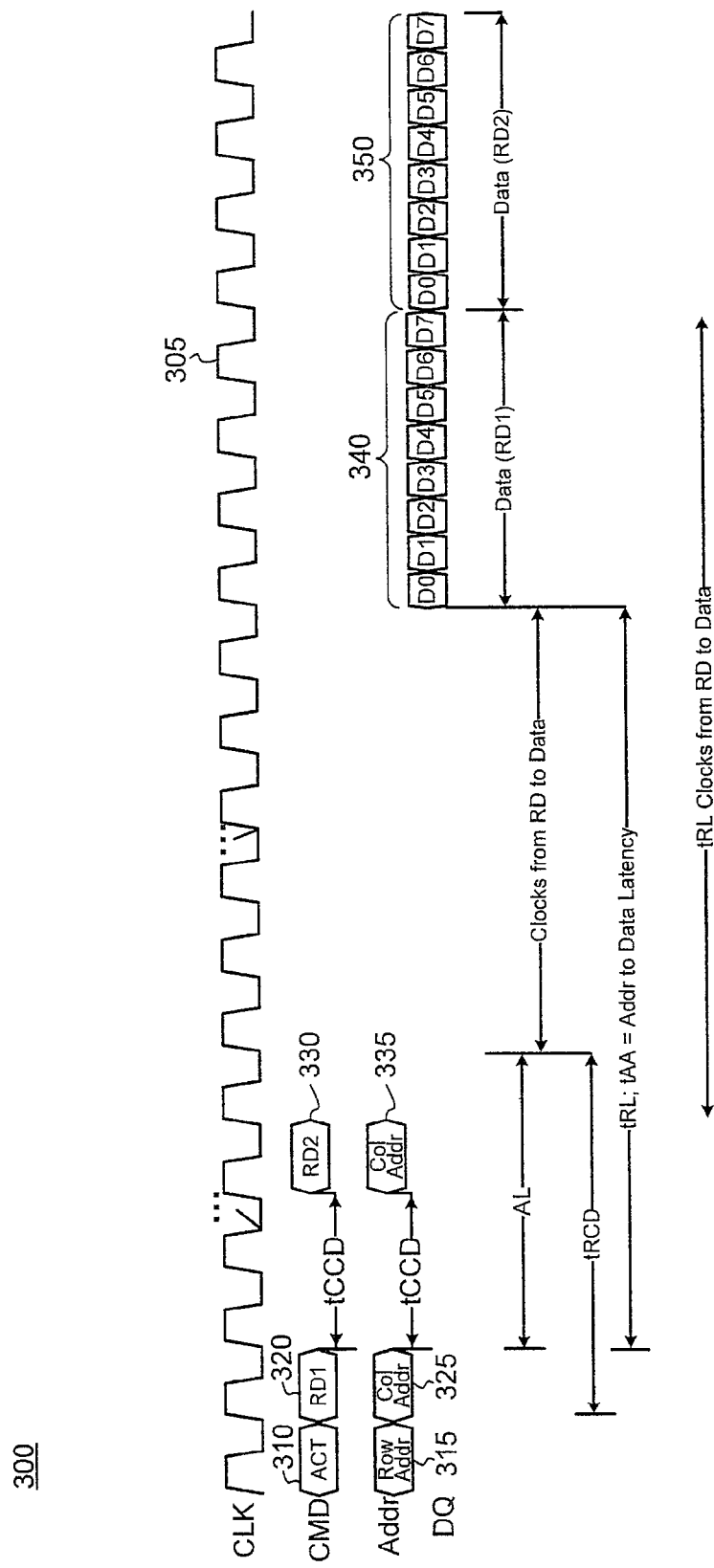
FIG. 3 is a timing diagram of a memory control process, according to an embodiment.
Figure 4:
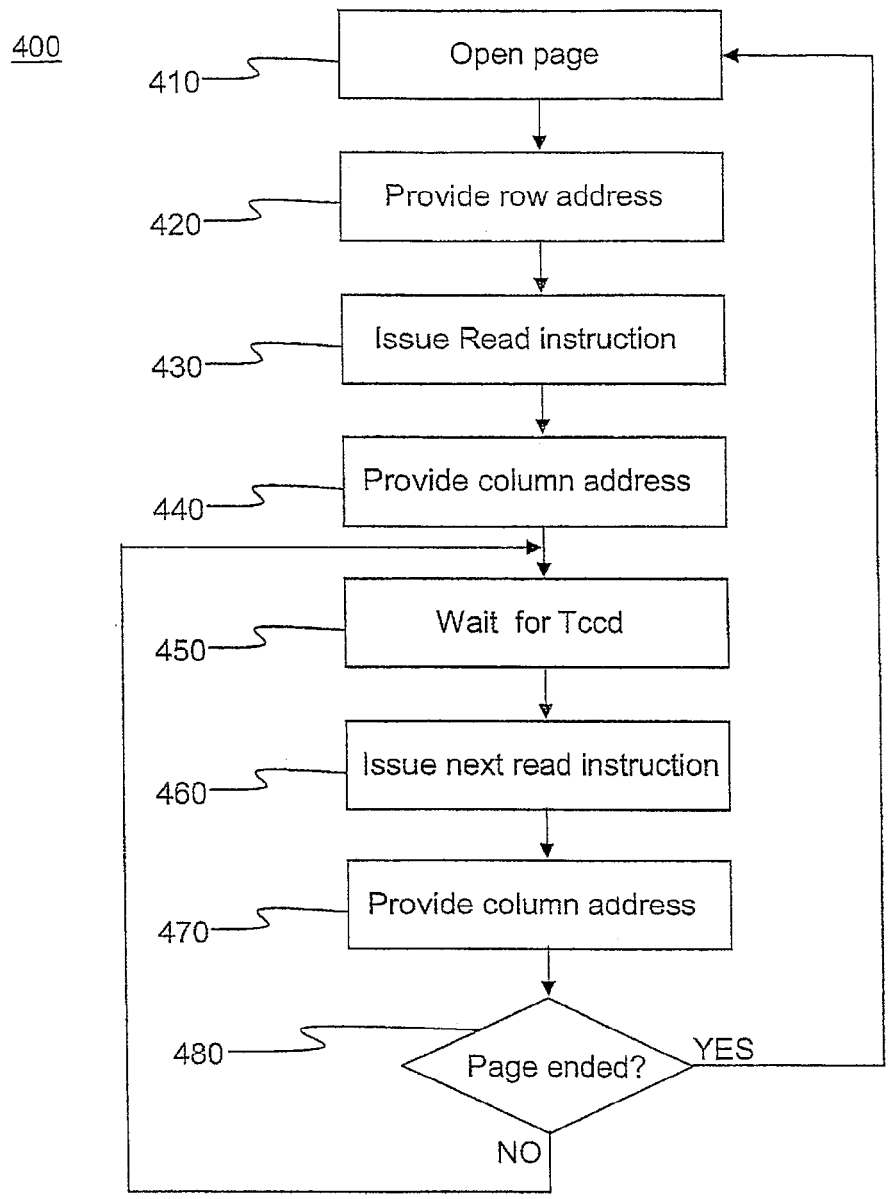
FIG. 4 is a flow diagram of a memory control process, according to an embodiment.

FIG. 3 is a timing diagram of a memory control process 300, and FIG. 4 is a flow diagram of a memory control process 400, according to an embodiment. The following descriptive example is based on memory control process 300 and memory control process 400 comprising the same process, though claimed subject matter is not so limited. As shown in FIG. 3, a clock signal 305 may establish timing of memory processes. At block 410, a memory controller may issue an activate command 310 to open a page or memory bank of a PCM module, such as PCM module 214 shown in FIG. 2, for example. During such an activate phase, a PCM module may receive a row address 315 from a memory controller, as in block 420. At blocks 430 and 440, a memory controller may issue a read instruction 320 and a column address 325, thus providing a memory address (row and column) of one or more memory cells from where data is to be read. In a particular implementation, an additive latency may be used to improve memory process scheduling: a row address and a column address may be issued back-to-back, thereby avoiding timing gaps in output data, for example. Such timing gaps, however, may be desirable in some applications, and claimed subject matter is not so limited. For example, though not shown in FIG. 3, there may be one or more clock cycles between activate command 310 and read instruction 320. In detail, utilizing column address strobe (CAS) latency and/or additive latency, a read instruction may be issued immediately after an activate command. Such a read instruction need not be delayed internally by a predetermined number of clock cycles (hence additive latency) before being executed. Because such a timing process is performed without need for an additional command, collision among memory instructions may be avoided.

Though not needed for one or more embodiments described herein, a value for additive latency may be maintained in a mode register of the PCM module. Accordingly, at block 450, a period tCCD lapses before another read instruction 330 is issued, at block 460. Concurrently, another column address may be issued, as at block 470. After one or more latencies, such as read latency and column addressing latency for example, data 340 may result from read instruction 320 and data 350 may result from read instruction 330. In one implementation, a process of providing column addresses and reading memory at the corresponding addresses may repeat until, for example, a final column of the opened page is reached, as checked at block 480. In such a case, another activate command may be issued by a memory controller to open another page. As indicated above, PCM modules may be incorporated in a DIMM that is adapted to electronically operate based, at least in part, on DRAM modules. To accommodate such PCM modules, appropriate memory-level and/or system-level processes and/or parameters, may be implemented. For example, at a system level, a BIOS may retrieve parameters from one or more mode registers maintained in PCM modules or other memory. Such parameters, comprising values for read latency, write latency, CAS latency, internal read command to first data time, activate to internal read/write delay, and/or additive delay, just to name a few examples, may correspond to the PCM modules.

Figure 5:
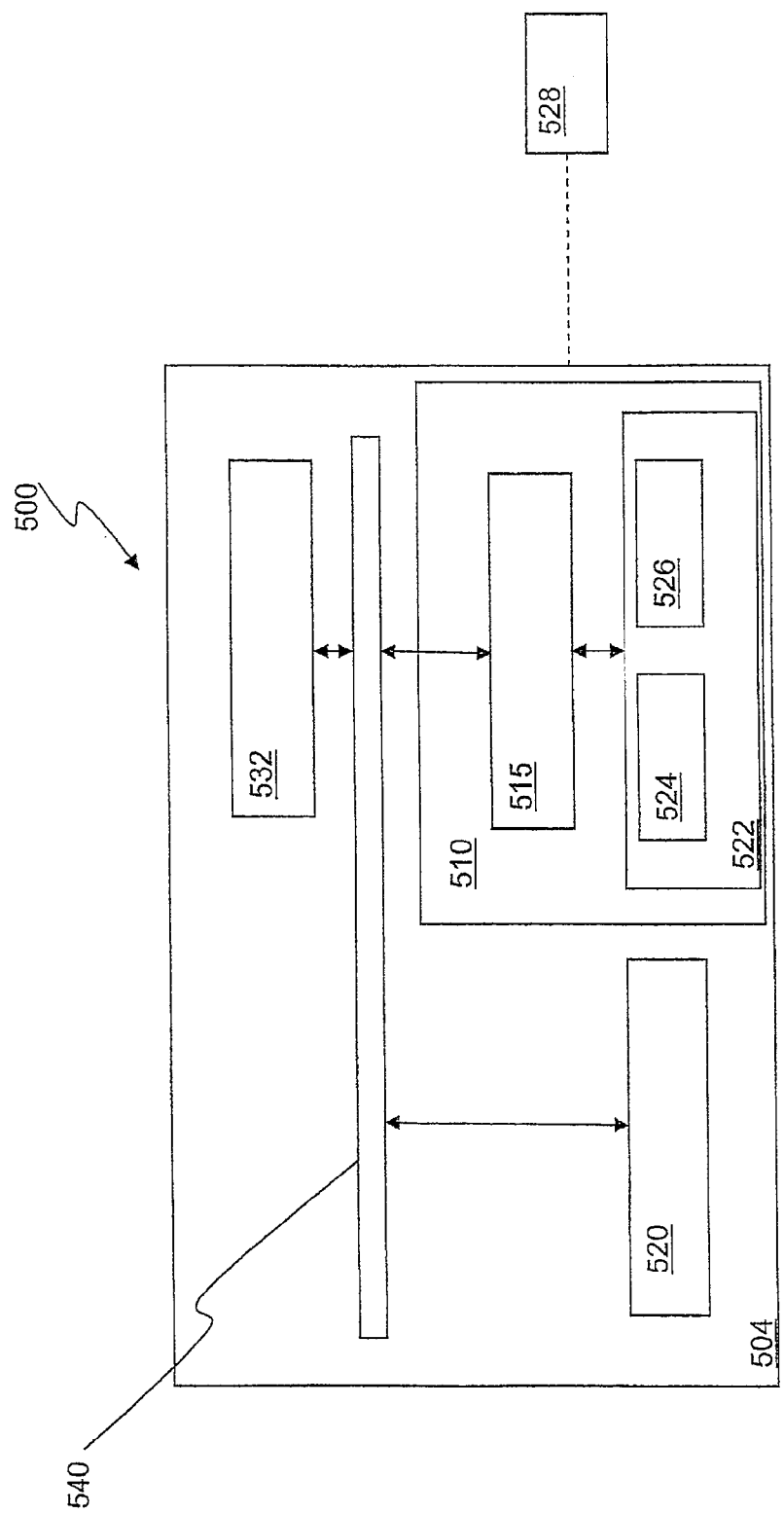
FIG. 5 is a schematic view of a computing system and a memory device, according to an embodiment.

FIG. 5 is a schematic diagram illustrating an exemplary embodiment of a computing system 500 including a memory device 510. A computing device 504 may be representative of any device, appliance, or machine that may be configurable to manage memory device 510. Memory device 510 may include a memory controller 515 and a memory 522. By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515. Processing unit 520 is representative of one or more circuits configurable to perform at least a portion of a data computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may communicate with memory controller 515 to process memory-related operations, such as read, write, and/or erase, as well as memory partition processes discussed above, for example. Processing unit 520 may include an operating system adapted to communicate with memory controller 515. Such an operating system may, for example, generate commands to be sent to memory controller 515 over bus 540. Such commands may include read/write instructions, for example. Computing device 504 may comprise a basic input/output system (BIOS) that maintains parameters corresponding to PCM modules, which may be associated with an additive latency that enables a column address, generated by memory controller 515 for example, to be provided to a DIMM immediately after the DIMM receives a row address.

Memory 522 is representative of any data storage mechanism. Memory 522 may include, for example, a primary memory 524 and/or a secondary memory 526. In a particular embodiment, memory 522 may comprise a PCM DIMM, as described above. In particular, primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

According to an embodiment, one or more portions of memory 522 may store signals representative of data and/or information as expressed by a particular state of memory 522. For example, an electronic signal representative of data and/or information may be "stored" in a portion of memory 522 by affecting or changing the state of such portions of memory 522 to represent data and/or information as binary information (e.g., ones and zeros). As such, in a particular implementation, such a change of state of the portion of memory to store a signal representative of data and/or information constitutes a transformation of memory 522 to a different state or thing.

Secondary memory 526 may include, for example, the same or similar type of memory as primary memory and/or one or more data storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry and/or make accessible data, code and/or instructions for one or more of the devices in system 500.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method, comprising:
issuing an activate command to a phase change memory (PCM) module during a first time interval, wherein a dual inline memory module (DIMM) comprises the PCM module;
conveying a first row address to the PCM module during the first time interval based at least in part on issuing the activate command;
issuing a first access instruction to the PCM module during a second time interval after the first time interval;
conveying a first column address to the PCM module during the second time interval based at least in part on issuing the first access instruction; and
caching write data for the PCM module in a dynamic random access memory (DRAM) cache memory based at least in part on a cycling limit of the PCM module.

2. The method of claim 1, further comprising:
retrieving a parameter from a register associated with the PCM module.

3. The method of claim 2, wherein the parameter comprises a value associated with an additive latency of the PCM module.

4. The method of claim 1, wherein issuing the activate command comprises providing the activate command to the DIMM, and wherein the first access instruction comprises a read instruction or a write instruction.

5. The method of claim 1, wherein the first time interval and the second time interval are immediately adjacent.

6. A method, of comprising:
issuing an activate command to a phase change memory (PCM) module during a first time interval, wherein a dual inline memory module (DIMM) comprises the PCM module, wherein a page of the PCM module is opened based at least in part on issuing the activate command;
conveying a first row address to the PCM module during the first time interval based at least in part on issuing the activate command;
issuing a first access instruction to the PCM module during a second time interval after the first time interval;
conveying a first column address to the PCM module during the second time interval based at least in part on issuing the first access instruction;
issuing a second access instruction to the PCM module during the second time interval; and
conveying a second column address to the PCM module during the second time interval based at least in part on issuing the second access instruction.

7. The method of claim 6, further comprising:
conveying a second row address to the PCM module after conveying the second column address to the PCM module.

8. A method, comprising:
issuing an activate command to a phase change memory (PCM) module during a first time interval, wherein a dual inline memory module (DIMM) comprises the PCM module;
conveying a first row address to the PCM module during the first time interval based at least in part on issuing the activate command;
issuing a first access instruction to the PCM module during a second time interval after the first time interval;
conveying a first column address to the PCM module during the second time interval based at least in part on issuing the first access instruction;
retrieving a parameter from a register associated with the PCM module, wherein the parameter comprises a value associated with an additive latency of the PCM module; and
delaying issuing a second read instruction to the PCM module based at least in part on the value associated with the additive latency.

9. The method of claim 8, further comprising:
determining that the value associated with the additive latency is satisfied; and
issuing the second read instruction to the PCM module based at least in part on the determining.

10. The method of claim 8, wherein conveying multiple column addresses to the PCM module during the second time interval is based at least in part on the value associated with the additive latency, wherein the multiple column addresses comprises the first column address.

11. The method of claim 10, wherein the first time interval and the second time interval indicate a phase for accessing the multiple column addresses, wherein each of the multiple column addresses is associated with a different column of the first row address of the PCM module.

12. A method, comprising:
issuing an activate command to a phase change memory (PCM) module during a first time interval, wherein a dual inline memory module (DIMM) comprises the PCM module;
conveying a first row address to the PCM module during the first time interval based at least in part on issuing the activate command;
issuing a first access instruction to the PCM module during a second time interval after the first time interval;
conveying a first column address to the PCM module during the second time interval based at least in part on issuing the first access instruction; and
delaying accessing PCM cells associated with the first row address and the first column address based at least in part on an additive latency of the PCM module, wherein a length of the additive latency is based at least in part on a latency associated with accessing memory cells in a DRAM module included in the DIMM.

13. An apparatus, comprising:
a dual inline memory controller (DIMM) comprising a phase change memory (PCM) module; and
a memory controller coupled with the DIMM and configured to:
issue an activate command to the PCM module during a first time interval;

convey a first row address to the PCM module during the first time interval based at least in part on issuing the activate command;

issue a first access instruction to the PCM module during a second time interval after the first time interval;

convey a first column address to the PCM module during the second time interval based at least in part on issuing the first access instruction; and cache write data for the PCM module in a dynamic random access memory (DRAM) cache memory based at least in part on a cycling limit of the PCM module.

14. The apparatus of claim 13, wherein the memory controller is further configured to:

issue a second access instruction to the PCM module during the second time interval; and convey a second column address to the PCM module during the second time interval based at least in part on issuing the second access instruction.

15. The apparatus of claim 13, wherein the memory controller is further configured to:

retrieve a parameter from a register associated with the PCM module, wherein the parameter comprises a value associated with an additive latency of the PCM module.

16. An apparatus, comprising:

a dual inline memory controller (DIMM) comprising a phase change memory (PCM) module; and a memory controller coupled with the DIMM and configured to:

issue an activate command to the PCM module during a first time interval;

convey a first row address to the PCM module during the first time interval based at least in part on issuing the activate command;

issue a first access instruction to the PCM module during a second time interval after the first time interval;

convey a first column address to the PCM module during the second time interval based at least in part on issuing the first access instruction;

retrieve a parameter from a register associated with the PCM module, wherein the parameter comprises a value associated with an additive latency of the PCM module; and delay issuing a second read instruction to the PCM module based at least in part on the value associated with the additive latency.

17. The apparatus of claim 16, wherein the memory controller is further configured to:

determine that the value associated with the additive latency is satisfied; and issue the second read instruction to the PCM module based at least in part on the determining.

18. A method, comprising:

issuing a first activate command to a dynamic random access memory (DRAM) module comprising a first number of banks that are addressable, each bank address comprising a first plurality of bits; and issuing a second activate command to a phase change memory (PCM) module comprising a second number of banks that are addressable, each bank address comprising the first plurality of bits, wherein the second number of banks is less than the first number of banks, and wherein a bank address for the second activate command simultaneously activates multiple banks of the second number of banks.

19. A method, comprising:

issuing a first activate command to a dynamic random access memory (DRAM) module comprising a first number of banks that are addressable, each bank address comprising a first plurality of bits;

issuing a second activate command to a phase change memory (PCM) module comprising a second number of banks that are addressable, each bank address comprising the first plurality of bits, wherein the second number of banks is less than the first number of banks, and wherein multiple banks of the second number of banks are accessed based at least in part on issuing the second activate command;

issuing a first access command to the PCM module comprising a first bank address corresponding to the multiple banks based at least in part on issuing the second activate command;

conveying a first column address to the PCM module based at least in part on issuing the first access command; and accessing a first set of PCM cells in a first bank of the multiple banks and a second set of PCM cells in a second bank of the multiple banks based at least in part on issuing the first access command and conveying the first column address.

* * * * *